(12) United States Patent
Kosinski et al.

(10) Patent No.: US 7,132,908 B1
(45) Date of Patent: Nov. 7, 2006

(54) SELECTABLE PERFORMANCE FILTER

(75) Inventors: John A. Kosinski, Neptune, NJ (US);
Robert A. Pastore, Jr., Freehold, NJ (US); Hong-Liang Cui, Basking Ridge, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 10/943,832

(22) Filed: Sep. 16, 2004

(51) Int. Cl.
*H03H 7/42* (2006.01)
*H03H 9/25* (2006.01)

(52) U.S. Cl. .................. 333/166; 333/193; 333/196

(58) Field of Classification Search ............... 333/152, 333/154, 166, 193, 194, 196; 348/614
See application file for complete search history.

(56) References Cited

U.S. PATENT DOCUMENTS

| | | | |
|---|---|---|---|
| 4,013,834 A * | 3/1977 | Kino et al. ................ | 348/614 |
| 4,034,199 A | 7/1977 | Lampe et al. | |
| 4,612,522 A | 9/1986 | Dyck | |
| 4,739,290 A * | 4/1988 | Minarik et al. ............ | 333/152 |
| 4,752,750 A * | 6/1988 | Zimmerman et al. ....... | 333/166 |
| 5,225,798 A | 7/1993 | Hunsinger et al. | |
| 5,325,130 A * | 6/1994 | Miller et al. ............. | 348/614 |
| 5,387,887 A | 2/1995 | Zimmerman et al. | |
| 6,459,345 B1 * | 10/2002 | Kosinski et al. ........... | 333/166 |
| 6,492,884 B1 | 12/2002 | Kosinski et al. | |

OTHER PUBLICATIONS

Pastore, R. et al, "Design of a Selectable Performance Front End Filter Using Acoustic Surface Wave Resonators", Proceedings of the 1997 IEEE International Frequency Control Symposium, May 1997, pp. 858-866.

Zhu, J. et al, "A Multi-IDT Input Tunable Surface Acoustic Wave Filter," IEEE Transactions on Ultrasonics, Ferroelectrics, and Frequency Control, Sep. 2001, vol. 48, No. 5 pp. 1383-1388.

Hunt, W.D. et al, "Ballato Electronic Circuit Models for Programmable SAW Filters", 1999 IEEE International Ultrasonics Symposium Proceedings, Oct. 1999, pp. 155-159.

(Continued)

*Primary Examiner*—Dean Takaoka
(74) *Attorney, Agent, or Firm*—Michael Zelenka; George B. Tereschuk

(57) ABSTRACT

RF programmable SAW filters achieve selectable filter performance by providing tunable input and output interdigital (IDTs) with different synchronous frequencies and substantially reduce electromagnetic interference (EMI) associated with RF signals not of interest. The RF programmable SAW filter includes tunable input and output IDT's, with the input and output IDT's having different input and output IDT synchronous frequencies. The input signal is divided into multiple output signals along multiple signal paths that are applied to an input tap weight network wherein the amplitude of each output signal may be varied individually. The individually weighted signal paths are then applied one each to individual IDT input electrode fingers in a means for IDT input, which is characterized by a synchronous frequency $F_{in}$. The IDT input means generates an acoustic wave that propagates to a means for IDT output, which is characterized by a synchronous frequency $F_{out}$, where $F_{in}$ and $F_{out}$ are not the same. The electrical signals generated in the IDT output means are processed through an output tap weight network, and the output signal is formed as a weighted sum to provide a selectable center frequency, a selectable bandwidth, a minimum insertion loss, a maximum sidelobe rejection level and a selectable filter transfer function, or phase/magnitude profile.

RF programmable SAW filters, RF partially programmable SAW filters, RF fully programmable SAW filters and a method for making programmable RF SAW filters are provided.

40 Claims, 13 Drawing Sheets

OTHER PUBLICATIONS

Zhu, J. et al, "A Prototype of Tunable Surface Acoustic Wave Filter", 1999 IEEE International Ultrasonics Symposium Proceedings, Oct. 1999, pp. 47-50.

Pastore, R. et al, "An Improved Tunable Filter Topology for HF Preselection", 1998 IEEE International Frequency Control Symposium, May 1998, pp. 575-579.

* cited by examiner (a)
(PRIOR ART)

SELECTABLE PERFORMANCE FILTER

GOVERNMENT INTEREST

The invention described herein may be manufactured, used, and licensed by or for the United States Government for governmental purposes without payment to us of any royalties thereon.

FIELD OF THE INVENTION

The present invention relates to the field of radio frequency (RF) filters with application to RF receivers. More particularly, the present invention relates to a selectable performance filter based on surface acoustic wave transversal filters.

BACKGROUND OF THE INVENTION

Rationale for a Selectable Performance Filter and Critical Characteristics Thereof Surface Acoustic Wave (SAW) programmable transversal filters with a limited degree of selectable performance are well known in the art. A fixed input interdigitated transducer (hereinafter IDT) and an output array if individual finger taps are disposed on each SAW substrate of such filters. Selectable performance is attained by connecting each of the output finger taps through a corresponding array of variable gain amplifiers, and forming the overall filter output as the summed output of the amplifier array. Several significant limitations, disadvantages and shortcomings have been encountered with such prior art filters. Center frequency tunability is restricted to essentially the passband of the fixed input IDT. Bandwidth tunability is accomplished in a cumbersome manner by varying the effective length of the output array, and is limited to those bandwidths associated with the output array delay length. Furthermore, the weighting circuit must perform a complex multiplication to provide unaliased center frequency tuning.

Communications receivers are often faced with the problem of trying to receive a weak communications signal in the presence of one or more strong interfering signals. Whereas the receiver may have sufficient sensitivity to receive the weak signal against a "quiet" background, when the background includes one or more strong interfering signals, the receiver will be desensitized to a level determined by the strength of the largest interfering signal and the dynamic range of the receiver. In these situations, it is highly desirable to include some sort of RF filtering at the receiver front-end in order to attenuate the interfering signals prior to the first gain stage. The critical RF parameters of the selectable performance front-end filter can be derived through a simple analysis of a generic receiver circuit. The analysis begins by considering the signal set as illustrated in FIG. 1. Desired signal 1 and undesired higher power interference signal 2 are present simultaneously but at different frequencies. These signals are applied to a generic, wide-open receiver as shown in FIG. 2. The major components of the receiver are antenna 10, RF amplifier 11, detector 12, IF amplifier 13 and comparator 14. The input to RF amplifier 11 is considered to be hard limited to a maximum power level Psat. RF amplifier 11 is characterized by gain G, noise figure F and noise power bandwidth $B_0$. Detector 12 is characterized by a tangential signal sensitivity TSS.

In a "quiet" RF environment, one can use an amount of gain G given by $$G=[TSS-(N+F)] \quad (1)$$

for maximum system sensitivity to weak signals. With a strong interference signal of P>(Psat−G), conventional automatic gain control (AGC) circuitry will reduce the system sensitivity by 1 dB for each 1 dB of P>(Psat−G) up to the hard limit, i.e., there is a potential loss in sensitivity up to a value of G. This process is illustrated in FIG. 3. FIG. 3(a) presents the power levels of desired signal 1 and undesired higher power interference signal 2 at the receiver input. These signals are compared to the thermal noise input to the receiver given by $N=kTB_0$, the thermal noise at the input to the detector given by N+F, the largest input signal level that maintains maximum signal sensitivity given by Psat−G (ideal), the TSS of the detector and the hard limit Psat. Given that the power level of undesired higher power interference signal 2 exceeds Psat−G(ideal), the AGC will reduce the gain to a value such that Psat−G(actual) is equal to the input power level of interference signal 2. FIG. 3(b) presents the resulting power levels of desired signal 1 and undesired interference signal 2 at the detector. These signals are compared to the same levels as in FIG. 3(a), along with the minimum detectable signal level given by TSS-G(actual). Both desired signal 1 and undesired signal 2 are increased by the value of G(actual), however this reduced value of gain is not enough to raise desired signal 1 being above the minimum detectable signal level.

One can add an RF filter 25 to the receiver front-end as illustrated in FIG. 4. The other major components of the receiver are as before antenna 20, RF amplifier 21, detector 22, IF amplifier 23 and comparator 24. RF filter 25 is characterized by bandwidth B, insertion loss I, and sidelobe (rejection) level S. The power of the undesired interference signal 2 is reduced by S dB. If the sidelobe (rejection) level is greater than the gain, that is, for S>G, the undesired interference signal 2 does not desensitize the receiver. At the same time, the insertion loss of RF filter 25 reduces the power in desired signal 1 by I dB, which for a constant noise floor, reduces the receiver sensitivity by I dB. However, the noise floor is increased by a factor of (F/I) arising from noise in RF amplifier 21 and decreased by a factor of $10\log(B/B_0)$ since the input thermal noise is band-limited by RF filter 25. If the decrease in noise floor due to the bandwidth reduction exceeds the noise increase due to the filter noise figure (≈1/I), then additional RF gain can be added for increased sensitivity. These considerations are illustrated in FIG. 5, wherein the signal power levels at the detector are illustrated for the receiver with front-end filter of FIG. 4. Desired signal 1 is first reduced by insertion loss I from an initial level of Psoi and then increased by gain G to a net power level of Psoi+G−I at the detector. In contrast, undesired interference signal 2 is first reduced by sidelobe (rejection) level S from an initial level of Psoi and then increased by gain G to a net power level of Psnoi+G−S at the detector. Thus, compared to a wide open system with RF bandwidth $B_0$ as illustrated in FIG. 4, the sensitivity in a quiet RF environment is degraded by $I+(F/I)-10\log(B/B_0)$, but the sensitivity in the presence of strong interference is improved by as much as $G-[I+(F/I)-10\log(B/B_0)]$ provided that S>G. The net result is a figure of merit for the system performance improvement resulting from RF filter 25 essentially given by sidelobe level S, which establishes how well the desensitization is obviated, minus the insertion loss I, which establishes how much the quiescent performance is degraded.

History and Background of Programmable SAW Transversal Filters

The above considerations, of course, presuppose that the filter center frequency and bandwidth are chosen so as to include desired signal 1 in the passband, and to exclude the undesired interference signal 2. Taking all of these factors into account, if RF filter 25 included a selectable center frequency, a selectable bandwidth, a minimum insertion loss, a maximum sidelobe (rejection) level and a selectable filter transfer function (phase/magnitude profile) the filter would seem to overcome the disadvantages, shortcomings and limitations of prior art devices. The ability of RF filter 25 to meet the performance goals depends in part on the choice of filter topology, and in part upon the technology used to implement RF filter 25. Prior developments in the field of programmable transversal filters based on surface acoustic wave devices and closely related fields that provide useful guidance on these choices are reviewed in "Design of a Selectable Performance Front End Filter Using Acoustic Surface Wave Resonators," by R. Pastore, J. A. Kosinski, W. N. Porter, and H. L. Cui, in Proceedings of the 1997 IEEE International Frequency Control Symposium, May 1997, pp. 858–866.

Filter and device topologies considered previously include IDT arrays, filter banks, variable wave velocity devices, dispersive delay devices, convolvers, correlators, matched filters and transversal filters. These devices have been implemented primarily using SAW technology. A device based upon acoustic charge transport (ACT) technology is disclosed in U.S. Pat. No. 5,225,798 titled "Programmable Transversal Filter" issued Jul. 6, 1993 to B. J. Hunsinger and J. E. Bales. Devices based upon charge coupled device (CCD) technology are disclosed in U.S. Pat. No. 4,612,522 titled "Mask Programmable Charge Coupled Device Transversal Filter" issued Sep. 16, 1986 to R. H. Dyck, and U.S. Pat. No. 4,034,199 titled "Programmable Analog Transversal Filter" issued Jul. 5, 1977 to D. R. Lampe, M. H. White, and J. H. Mims.

IDT arrays have been used to obtain selectable bandwidth. However, this technique requires unrealistically large delay paths to obtain narrow filter bandwidths. The filter bank approaches have achieved good electrical performance over limited ranges of center frequency and bandwidth. However, broadband tunability using this technique would require a substantial number of channels, also leading to prohibitively large devices.

Variable wave velocity has been used to obtain selectable delay time. However, this tuning is limited to a small fraction of the nominal wave velocity. Selectable center frequency also has been demonstrated using structures based on dispersive devices. However these structures are somewhat complicated and have inherent blanking time and bandwidth limitations.

Transversal filters have demonstrated selectable bandwidth and selectable center frequency as disclosed in U.S. Pat. No. 5,387,887 titled "Miniature Digitally Controlled Programmable Transversal Filter Using LSI GaAs Integrated Circuits" issued Feb. 7, 1995 to D. E. Zimmerman, J. W. Colver, and C. M. Panasik. To date, however, this selectability has been over a limited range determined in part by the use of a conventional input IDT structure. Promising results have been reported in regards to insertion loss (10 dB) and dynamic range (>70 dB), with less promising results reported for sidelobe levels (35 dB).

The full range of physical implementations have been reported, including discrete piezoelectric devices, hybrid devices using thin film piezoelectrics deposited on semiconducting substrates, and monolithic implementations using piezoelectric semiconductors.

Silicon, silicon-on-sapphire (SOS), and gallium arsenide have been used to implement the required tap weight and control circuits. Silicon has advantages with respect to cost and processing, while gallium arsenide has advantages with respect to critical circuit parameters.

Both passive and active tap weight control elements have been implemented. Active tap weight control elements have been based primarily on FET's, with a lone reference to bipolar technology. An alternative approach for tap weight control using fixed gain amplifiers and switch arrays is disclosed in Kosinski U.S. Pat. No. 6,492,884, entitled "Programmable Transversal Filter," issued on Dec. 10, 2002.

A wide variety of piezoelectric materials have been used to date, including piezoelectric ceramics, piezoelectric semiconductors, piezoelectric thin films (polycrystalline) and conventional single crystals. The most popular material to date has been single crystal lithium niobate.

Operating Principles of the Prior Art SAW Filters

The performance goals for RF filter 25 can be obtained readily with an ideal transversal filter 30 as illustrated in FIG. 6. In transversal filter 30, the input signal is applied to an input terminal 31 and propagates through a series of N delay elements 32. The time delay through each delay element 32 is denoted $\tau_n$. The signal is sampled between the delay elements 32, with each such sample following a path through one of N corresponding gain or weight control element 33 and thence to a summation element 34. The filter output 35 thus is formed as a weighted sum of the N delayed signal samples. Transversal filter 30 is, in theory, capable of producing an arbitrary transfer function $$H(f) = \sum_{n=1}^{N} a_n e^{-j2\pi f \tau_n}. \qquad (2)$$

The implementation of transversal filter 30 as a tapped delay line using conventional SAW technology is illustrated in FIG. 7. SAW transversal filter 40 is comprised of input IDT 42 and output IDT 43 deposited on the surface of piezoelectric substrate 41. Each IDT is composed of interdigitated fingers 45 alternately connected to busbars 44. The delay times $\tau_n$ are determined by the locations of the IDT fingers 45 along the propagation direction 46 and the SAW propagation velocity. The individual tap weights $a_n$ are established by techniques such as overlap, withdrawal, or phase-reversal weighting, and are implemented as fixed weights determined by the geometry of the IDT fingers 45. The summation operation is performed by the busbars 44 connecting the IDT fingers 45.

The SAW device geometry is primarily defined by the finger locations $x_n$ of the fingers 45 of input IDT 42 and by the finger locations $y_m$ of the fingers 45 of output IDT 43 as defined in FIG. 7. The transfer function for SAW transversal filter 40 for the case of unapodized (equal finger length) IDTs can be written $$H(f) = \sum_{n=1}^{N} I_n e^{-j\frac{2\pi f}{v_s}x_n} \sum_{m=1}^{M} J_m e^{j\frac{2\pi f}{v_s}y_m}, \quad (3)$$

where $I_n$ and $J_m$ represent the input and output IDT tap weights respectively. For unapodized IDTs, $I_n=J_m=1$ and H(f) is of the form $$H(f)=H_{in}(f)\, H_{out}(f) \quad (4)$$

Note that generic transversal filter 30 provides for a baseband or lowpass filter response, whereas SAW transversal filter 40 produces a bandpass response. This is a result of the polar nature of the piezoelectric effect, which requires that IDT fingers 45 have alternating polarity, implemented via the alternating connections of fingers 45 to busbars 44. Consequently, the SAW tap weights incorporate a factor of $$(-1)^n = \cos\left(\frac{2\pi f_0 x_n}{v_s}\right) = \cos(2\pi f_0 \tau_n), \quad (5)$$

which is equivalent to frequency translation of the baseband response to a carrier frequency $f_0$. This implicit frequency translation mechanism can be extended to essentially arbitrary frequency translation to $f_c$ by incorporation of an additional factor of $\exp[j2\pi(f_c-f_0)]$ in the IDT tap weights. This principle is the basis of a tunable output IDT as employed in the partially programmable SAW transversal filter disclosed by D. E. Zimmerman, J. W. Colver, and C. M. Panasik in U.S. Pat. No. 5,387,887. In the tunable IDT, the tap weights are not established as fixed values by the by the geometry of the IDT metallization using conventional overlap, withdrawal, or phase-reversal weighting techniques and connection to a common set of busbars. Rather, the tunable IDT fingers are formed as independent conductive stripes, and the tap weights are established by circuit elements interposed between the tunable IDT fingers and the summation circuit in order to effect the required tuning factor of $\exp[j2\pi(f_c-f_0)]$ in the IDT tap weights.

The programmable SAW transversal filters reported to date such as that of U.S. Pat. No. 5,387,887 are only partially programmable, in that they use conventional, fixed input IDTs in combination with tunable output IDTs. This partially programmable SAW transversal filter topology is illustrated schematically in FIG. 8. FIG. 8(a) illustrates the topology for the case of real tap weights, and FIG. 8(b) illustrates the topology for the case of complex tap weights. In FIG. 8(a), input signal 50 is applied to conventional IDT 51, which then generates an acoustic signal that passes to finger array 52. The electrical signals generated in finger array 52 are processed through tap weight network 53, and the output signal 55 is formed as the weighted sum via summation circuit 54. As shown in FIG. 8(b), complex tap weights are implemented using two parallel channels coupled through 90° hybrid couplers 56 at both input and output ports. In the SAW device implementation, input IDT 51 and finger array 52 are implemented as a piezoelectric device 60 as illustrated in FIG. 9. Piezoelectric device 60 is comprised of piezoelectric substrate 61, upon which are deposited conventional input IDT 62 and tunable output IDT 63. Conventional input IDT 62 is comprised of interdigitated fingers 65 alternately connected to busbars 64. Tunable output IDT 63 is comprised of independent fingers 66 each having a separate bonding pad 67 used to connect to the external tap weight circuitry. As in a conventional fixed SAW device, the partially programmable SAW transversal filter geometry is primarily defined by the finger locations $x_n$ of the fingers 65 of input IDT 62 and by the finger locations $y_m$ of the fingers 66 of output IDT 63 as defined in FIG. 9.

It is significant to note that, for the partially programmable SAW transversal filters considered to date, the periodicity of the fingers in both input and output IDTs is the same. That is, the input and output IDTs in the prior art share a common synchronous frequency. While promising in some aspects, the partially programmable SAW transversal filter topology of the prior art is inherently limited in meeting necessary performance goals such as selectable center frequency, selectable bandwidth, minimum insertion loss, maximum sidelobe (rejection) level and selectable filter transfer function (phase/magnitude profile). Thus there has been a long-felt need for a filter that meets these requirements and does not suffer from the disadvantages, shortcomings and limitations of the prior art devices.

Limitations of the Prior Art and Approaches Considered to Overcome the Limitations A first limitation on center frequency tunability arises from the use of a fixed input IDT, in that low insertion loss can only be obtained for center frequencies falling within the input IDT coupling bandwidth. This limitation is illustrated in FIG. 10(a) for the case of complex tap weights implemented as illustrated in FIG. 8(b). The transfer function 70 of the fixed input IDT and the untuned transfer function 71 of the tunable output IDT share a common synchronous frequency 72. The transfer function 70 of the fixed input IDT is maximum at the synchronous frequency 72, and since the total transfer function of the filter is the product of the input IDT transfer function 70 and the output IDT transfer function 71, the untuned filter transfer function is essentially the same as the transfer function 71 of the untuned output IDT. However, the application of frequency tuning to the output IDT results in a new, tuned output IDT transfer function 74 centered at a tuned frequency 73 different from the synchronous frequency 72. In this case, the product of the input IDT transfer function 70 and the tuned output IDT transfer function 74 results in a tuned filter transfer function 75 that is an attenuated and distorted version of the transfer function 71 of the untuned output IDT. A tunable input IDT would overcome this limitation, thus creating a fully programmable SAW transversal filter. The advantages of such an arrangement as well as the case for complex tap weights are illustrated in FIG. 10(b). The untuned transfer function 76 of the tunable input IDT and the untuned transfer function 71 of the tunable output IDT share a common synchronous frequency 72. In the fully programmable SAW transversal filter, frequency tuning is applied to both input and output IDTs resulting in tuned input IDT transfer function 77 and tuned output IDT transfer function 74 both centered at a tuned frequency 73 different from the synchronous frequency 72. In this case, the product of the tuned input IDT transfer function 77 and the tuned output IDT transfer function 74 results in a tuned filter transfer function essentially the same as the tuned output transfer function 74 without the attenuation and distortion of the prior art partially programmable SAW transversal filter. However, it should be noted that the advantages illustrated in FIG. 10 accrue only for the case of complex tap weights, thus requiring a complicated dual channel hardware implementation.

The limitation inherent in single channel implementations of real tap weights is illustrated in FIG. 11 for both (a) partially programmable and (b) fully programmable SAW transversal filters. Whereas complex tap weights provide unambiguous frequency translation, the use of real tap weights results in aliasing of the tuned IDT passband. In the untuned partially programmable SAW transversal filter, the transfer function 80 of the fixed input IDT and the untuned transfer function 81 of the tunable output IDT share a common synchronous frequency 82. The untuned output IDT transfer function 81, and hence the untuned filter transfer function formed as the product of the input and output IDT transfer functions both feature a single passband. However, when frequency tuning is applied using real tap weights, the output IDT transfer function develops two allowed passbands 83 and 84, each of which is a copy of the original untuned output IDT transfer function 81 displaced symmetrically above and below the synchronous frequency to new passband center frequencies 85 and 86. In consequence, the tuned filter transfer function exhibits two allowed passbands 87 and 88, each an attenuated and distorted copy of the original untuned transfer function.

The situation is not significantly different for the simple fully programmable SAW transversal filter of FIG. 12. The simple fully programmable SAW transversal filter 100 is comprised of piezoelectric substrate 101, upon which are deposited tunable input IDT 102 and tunable output IDT 103. Tunable input IDT 102 is composed of independent fingers 105 each having a separate bonding pad 104 used to connect to the external input tap weight circuitry. Similarly, tunable output IDT 103 is also composed of independent fingers 106 each having a separate bonding pad 107 used to connect to the external output tap weight circuitry. As in conventional SAW devices and partially programmable SAW transversal filters, the fully programmable SAW transversal filter geometry is primarily defined by the finger locations $x_n$ of the fingers 105 of input IDT 102 and by the finger locations $y_m$ of the fingers 106 of output IDT 103 as defined in FIG. 12. It is significant to note that for the simple fully programmable SAW transversal filter as illustrated, the periodicity of the fingers in both input and output IDTs is the same. That is, the input and output IDTs in the prior art share a common synchronous frequency. As illustrated in FIG. 11(b), the substitution of a tunable input IDT with untuned transfer function 89 simply leads to aliased tuned input IDT passbands 90 and 91. The shift from partial to full programmability reduces the attenuation and distortion of the overall filter transfer function, but does not eliminate the limitation of passband aliasing in the simpler and hence inherently more desirable single channel device using real tap weights.

The prior art also suffers from limitations on selectability of the passband bandwidth. The bandwidth of the IDT passband is approximately 1/T where T is the delay time required for the acoustic wave to propagate across the IDT. A longer IDT has a longer delay time and hence a narrower bandwidth, while a shorter IDT has the opposite characteristics. By turning taps on and off, the active length of the tunable output IDT can be varied from as short as ½ wavelength to as long as (N−1)/2 wavelengths where N is the number of active taps. Thus, the maximum active length of the tunable output IDT limits the minimum bandwidth of the prior art filter.

SUMMARY OF THE INVENTION

The general object of the present invention is to provide selectable filter performance. A specific object of the present invention is to achieve the general object without incurring the limitations of the prior art.

The present invention provides an improved RF filter capable of substantially reducing electromagnetic interference (EMI) associated with RF signals not of interest. In particular, the present invention relates to the field of tunable or variable RF filters, and even more specifically to those based upon surface acoustic wave (SAW) transversal filters.

The present invention obviates all of these limitations, disadvantages and shortcomings, providing simultaneously improved center frequency tunability, improved bandwidth tunability, and reduced passband aliasing. The rationale behind the present invention, its principles of operation, and its basic design criteria are presented fully in the following discussion. These and other objects are accomplished in accordance with the present invention by incorporating tunable IDT's at both the input and output of the filter, with the input and output IDT's having different synchronous frequencies. The scope of the present invention is only limited by the appended claims for which support is predicated on the preferred embodiments hereafter set forth in the following description and the attached drawings.

DETAILED DESCRIPTION OF THE PREFERRED EMBODIMENTS

Figure 1:
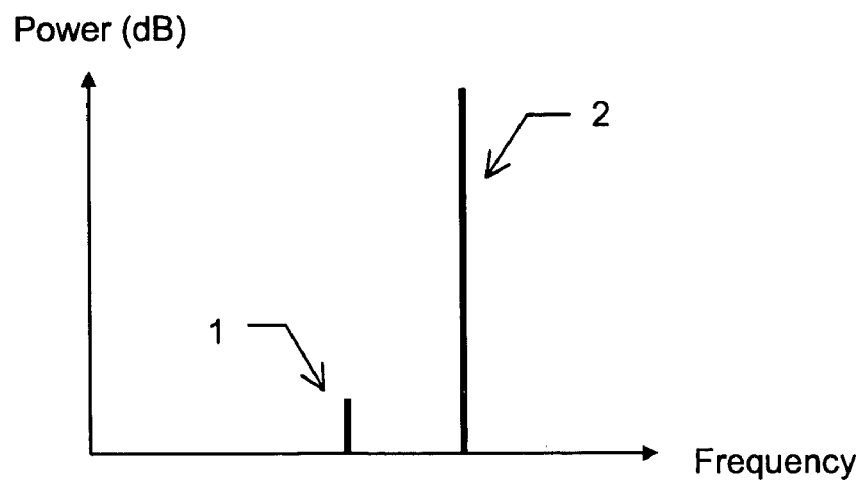
FIG. 1 is a diagram of the signal environment comparing power of a desired signal with that of an undesired interference signal.
Figure 2:
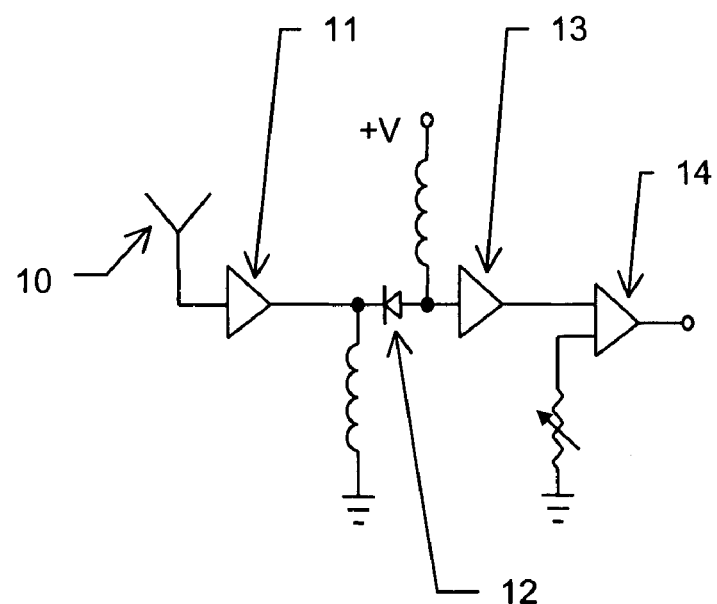
FIG. 2 is a circuit schematic of a generic wide-open receiver circuit.
Figure 3A:
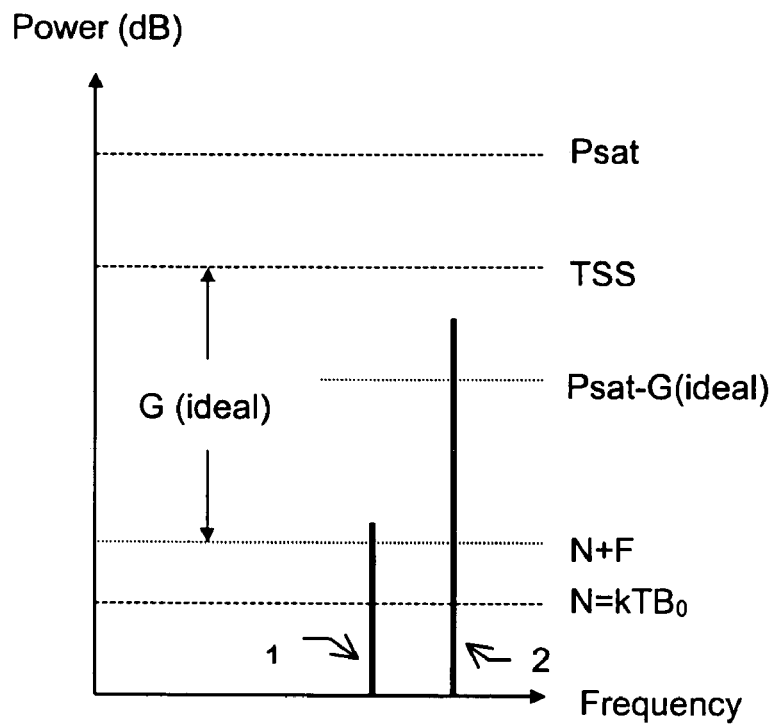
FIGS. 3(a)–(b) are diagrams of the signal levels when the generic wide-open receiver circuit is employed in the considered signal environment.
Figure 3B:
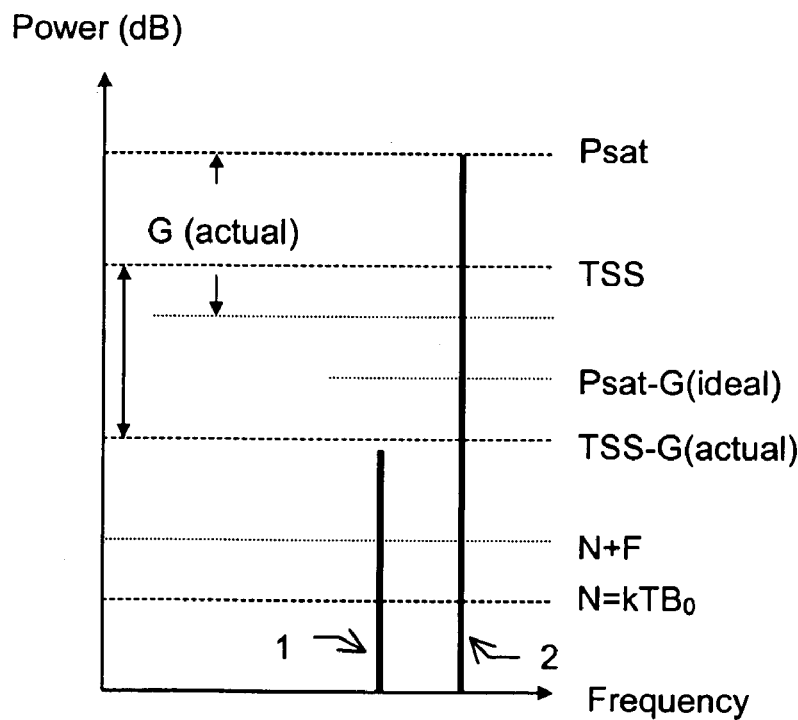
Figure 4:
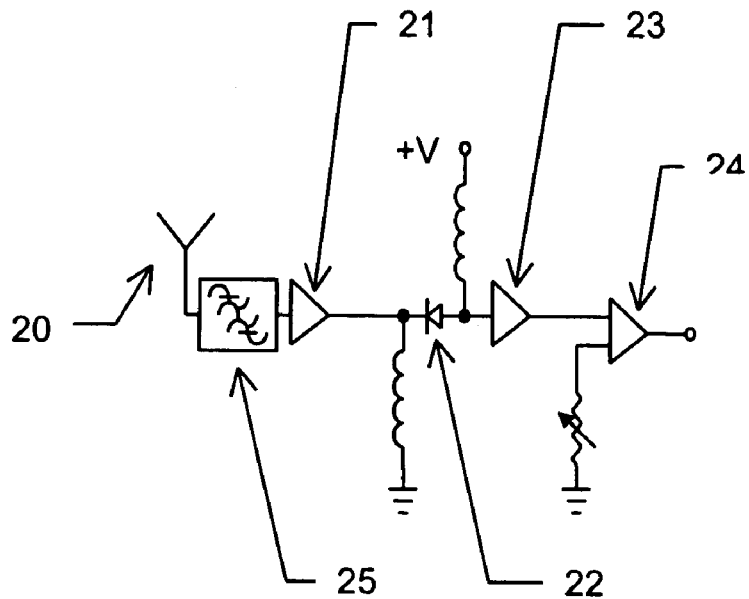
FIG. 4 is a circuit schematic of a receiver circuit with a preselector filter.
Figure 5:
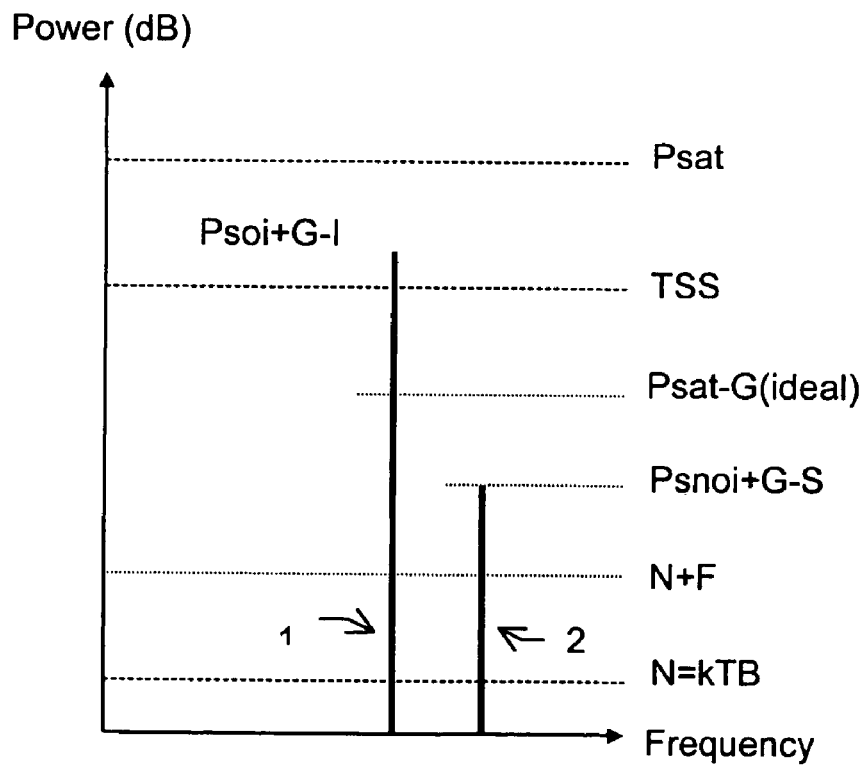
FIG. 5 is a diagram of the signal levels when the receiver circuit with a preselector filter is employed in the considered signal environment.
Figure 6:
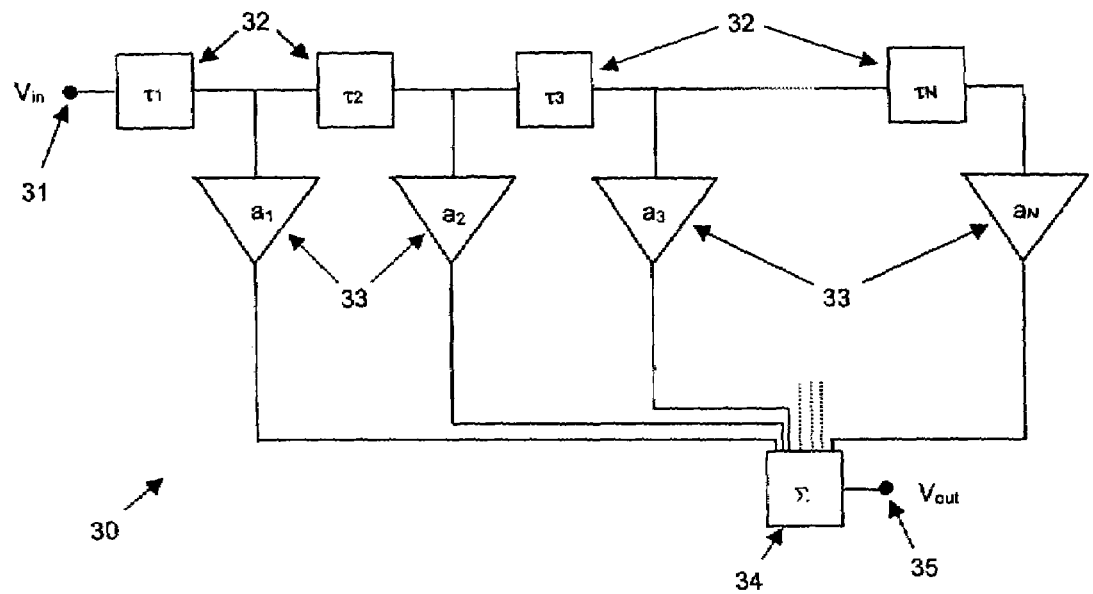
FIG. 6 is a schematic diagram of a generic transversal filter.
Figure 7:
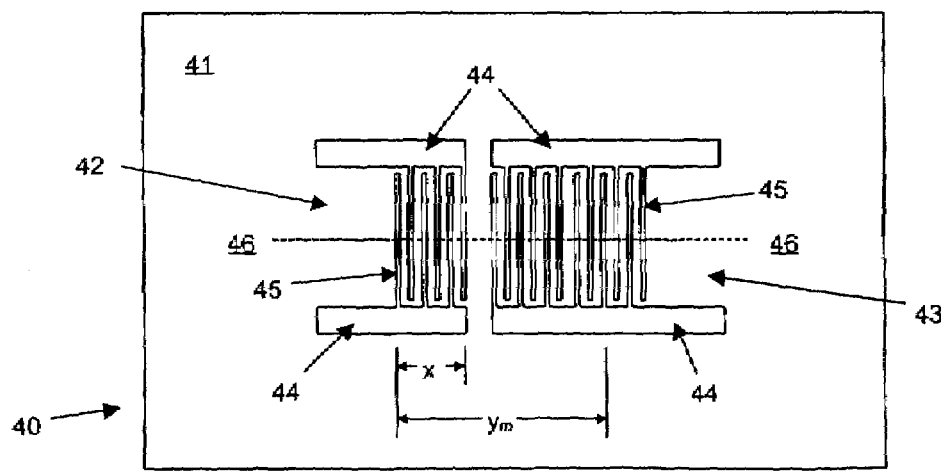
FIG. 7 is a top conceptual view of a prior art conventional (fixed) SAW filter.
Figure 8:
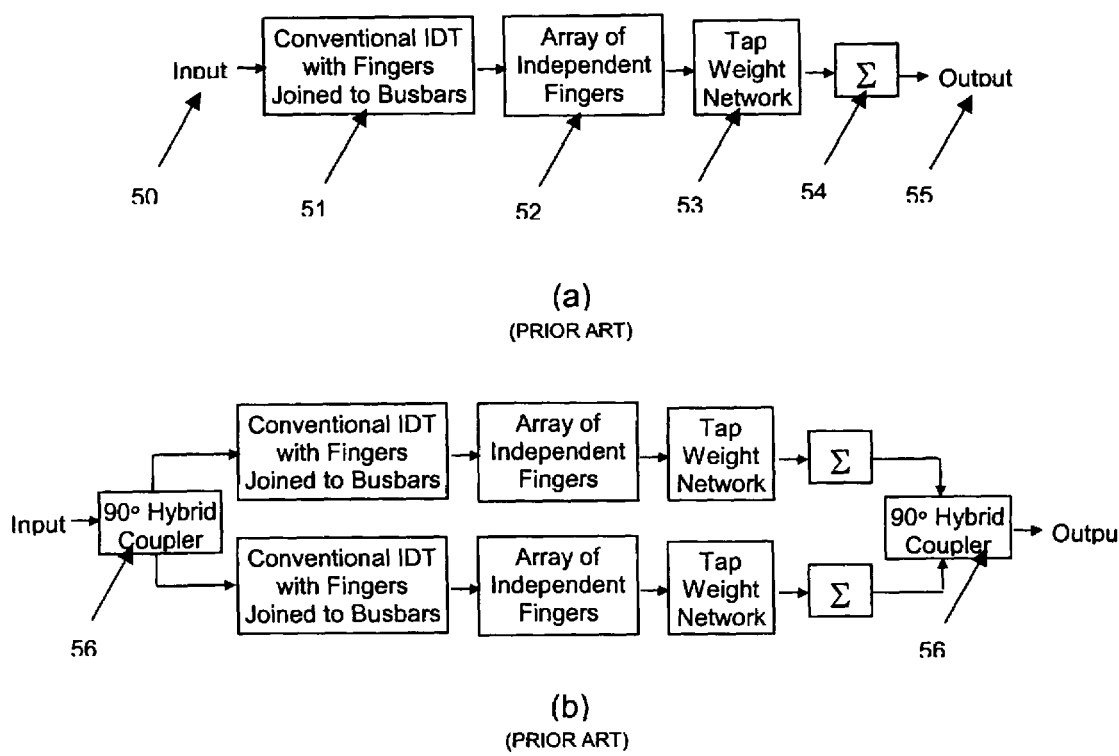
FIG. 8 is a set of schematic diagrams of the prior art partially programmable SAW filters.
Figure 9:
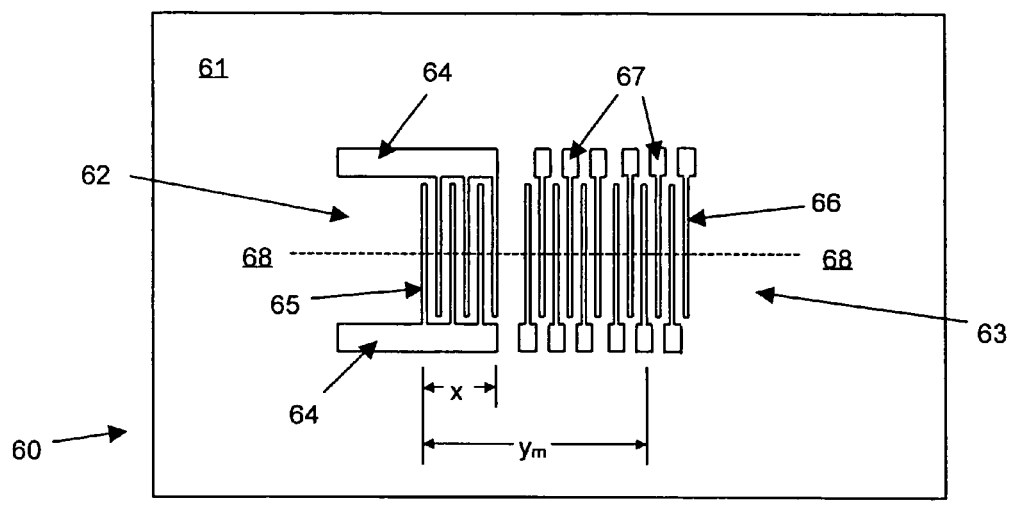
FIG. 9 is a top conceptual view of a prior art partially programmable SAW filter.
Figure 10:
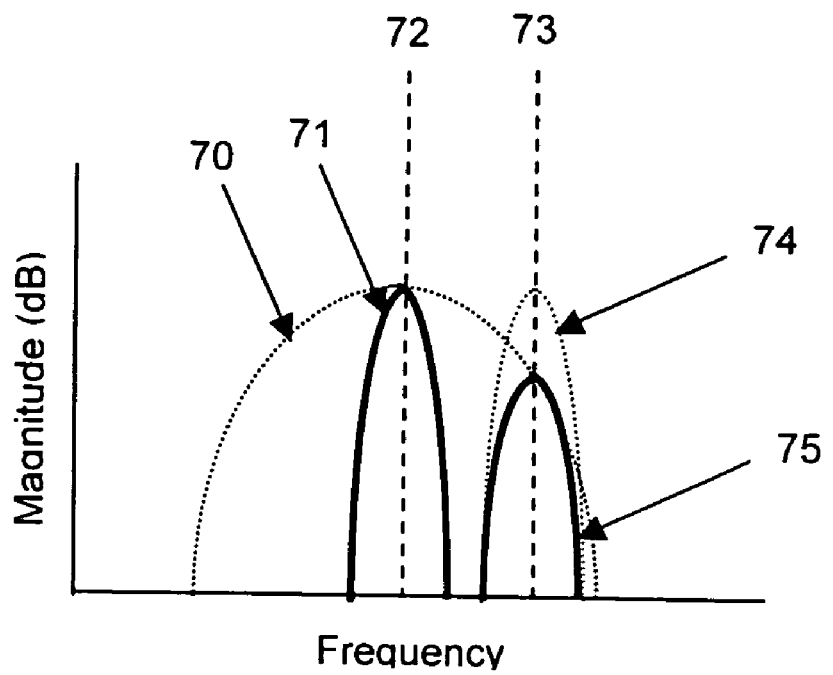
FIGS. 10(a)–(b) illustrate a transfer function of the prior art partially programmable SAW filter using complex tap weights.
Figure 10:
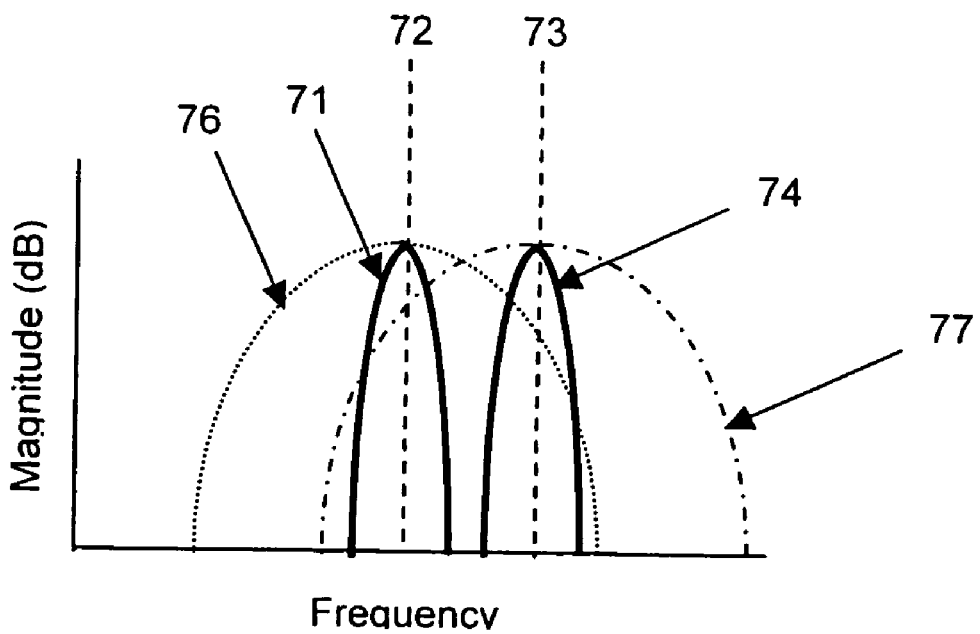
Figure 11:
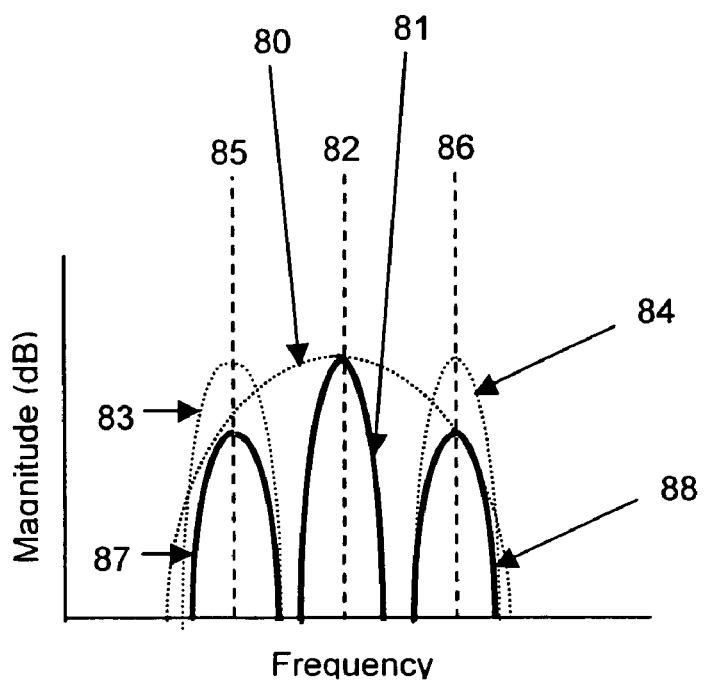
FIGS. 11(a)–(b) illustrate a transfer function of the prior art partially programmable SAW filter using real tap weights.
Figure 11:
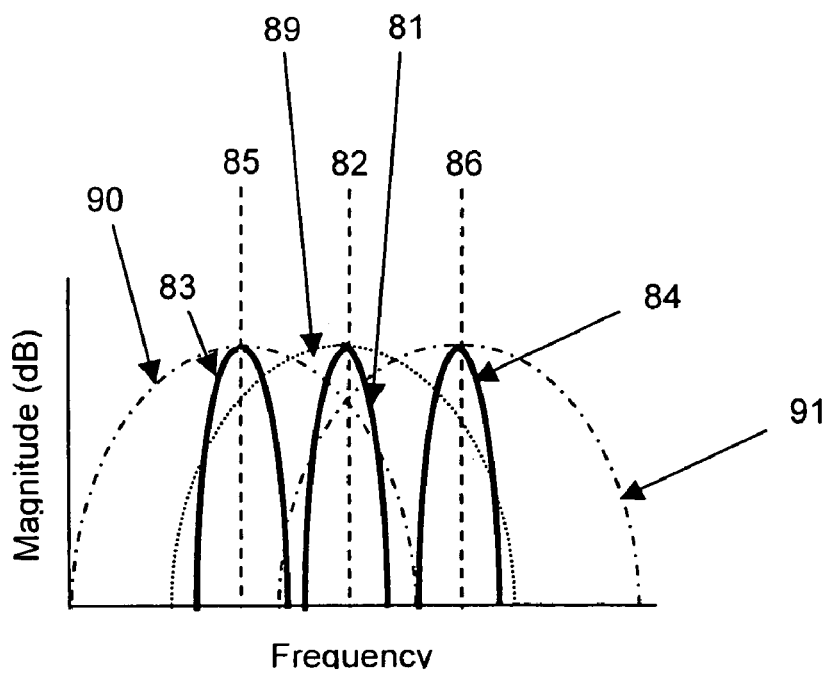
Figure 12:
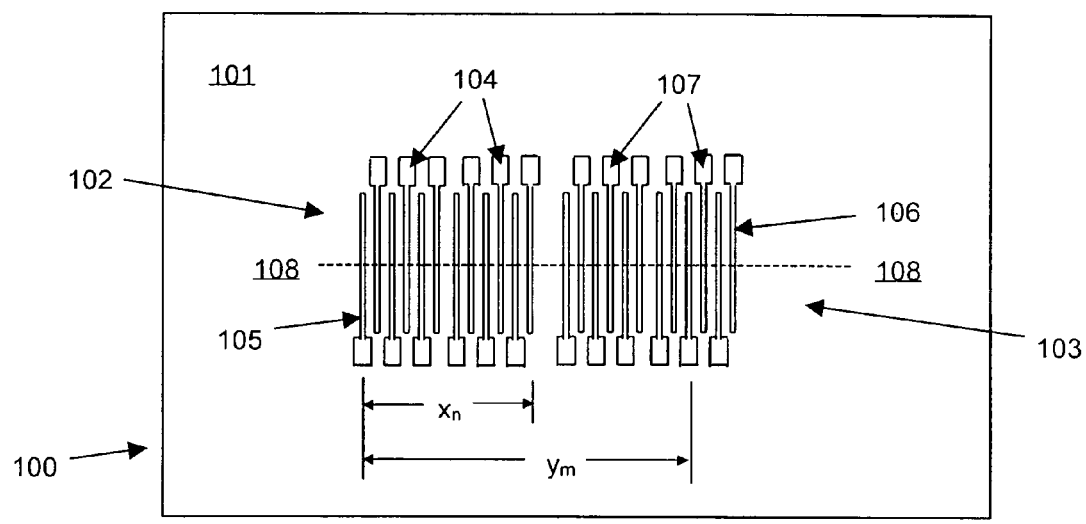
FIG. 12 is a top conceptual view of a considered fully programmable SAW filter.
Figure 13:
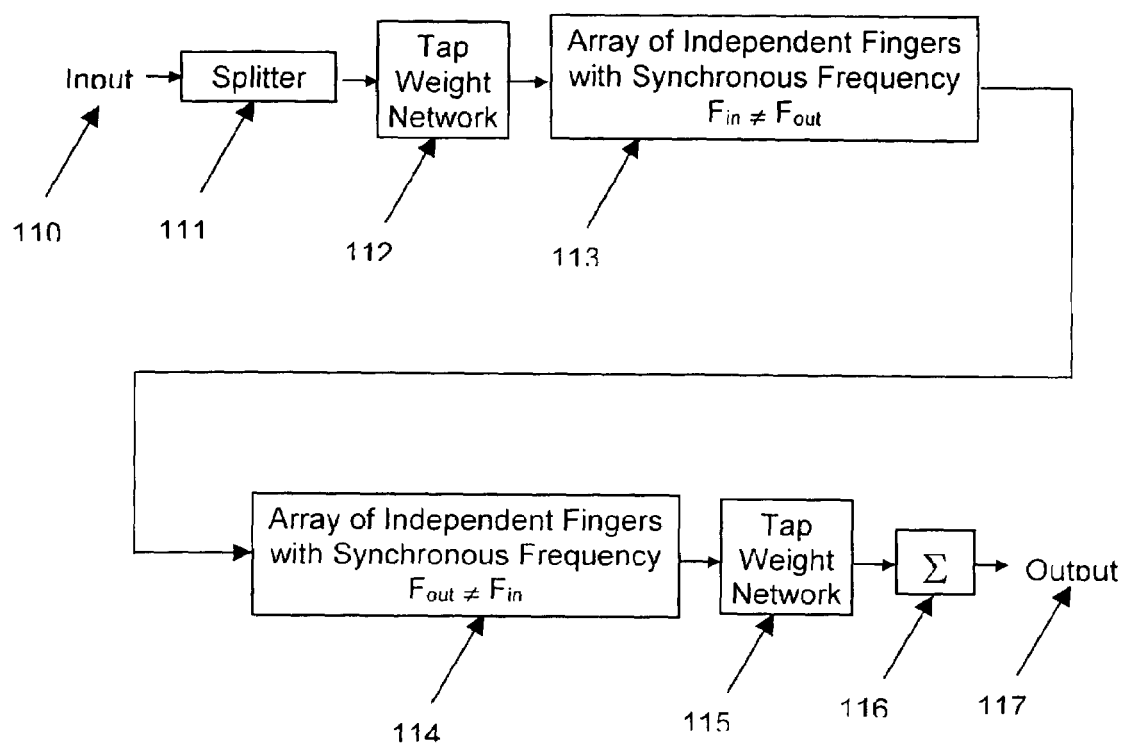
FIG. 13 is a schematic diagram of this invention's fully programmable SAW filter with differing IDT synchronous frequencies.

The limitations on center frequency and bandwidth tunability, as well as certain aspects of passband aliasing, can be overcome readily by the present invention using a more sophisticated fully programmable filter technique with different input and output IDT synchronous frequencies. The RF programmable SAW filter of the present invention is illustrated schematically in FIG. 13. In FIG. 13, input signal 110 is applied to a signal splitter 111 that divides the signal into multiple output signals along multiple signal paths. The outputs of the splitter are applied to a tap weight network 112 wherein the amplitude of each output signal may be varied individually. The individually weighted signal paths are then applied one each to individual fingers in a means for IDT input 113, which can be formed on a substrate as an array of independent electrode fingers. The IDT input means 113 is characterized by a synchronous frequency $F_{in}$. The IDT input means 113 generates an acoustic wave that propagates to a means for IDT output 114, which could also be formed on a substrate from an array of independent electrode fingers. The IDT output means 114 is characterized by a synchronous frequency $F_{out}$, where $F_{in}$ and $F_{out}$ are not the same. The electrical signals generated in the output IDT finger array 114 are processed through output tap weight network 115, and the output signal 117 is formed as a weighted sum via summation circuit 116.

Figure 14:
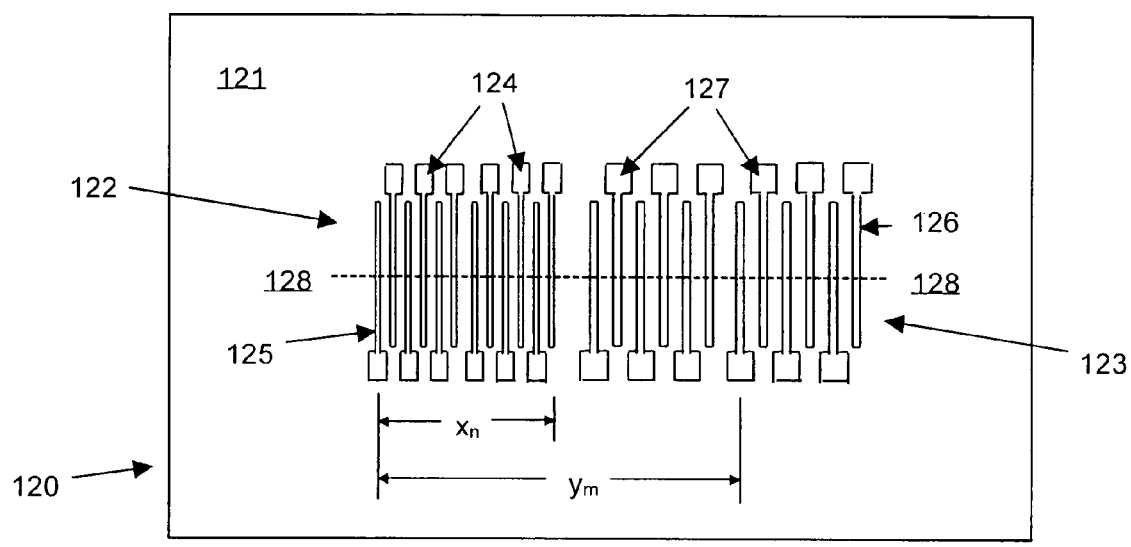
FIG. 14 is a top conceptual view of this invention's fully programmable SAW filter with differing IDT synchronous frequencies.

The preferred embodiment of the present invention as a SAW device is illustrated in FIG. 14. The fully programmable SAW transversal filter 120 is comprised of piezoelectric substrate 121, upon which are deposited a means for tunable IDT input 122 and a means for tunable IDT output 123. The tunable IDT input means 122 is comprised of independent fingers 125 each having a separate bonding pad 124 used to connect to the external input tap weight circuit. The tunable IDT output means 123 is comprised of independent fingers 126 each having a separate bonding pad 127 used to connect to the external output tap weight circuit. As in conventional SAW devices and partially programmable SAW transversal filters, the fully programmable SAW transversal filter geometry is primarily defined by the finger locations $x_n$ of the fingers 125 of tunable IDT input means 122 and by the finger locations $y_m$ of the fingers 126 of tunable IDT output means 123 as depicted in FIG. 14. It is significant to note that the input and output IDT means in the present invention feature differing synchronous frequencies. The use of different IDT synchronous frequencies is critical to obtaining the advantages of the present invention. The two additional degrees of freedom incorporated in this invention's technique, i.e. 1) a tunable input IDT and 2) differing IDT synchronous frequencies, allow for an efficient answer to the previous limitations. The present invention also encompasses an RF partially programmable SAW filter and a method for making a programmable RF SAW filter.

Figure 15:
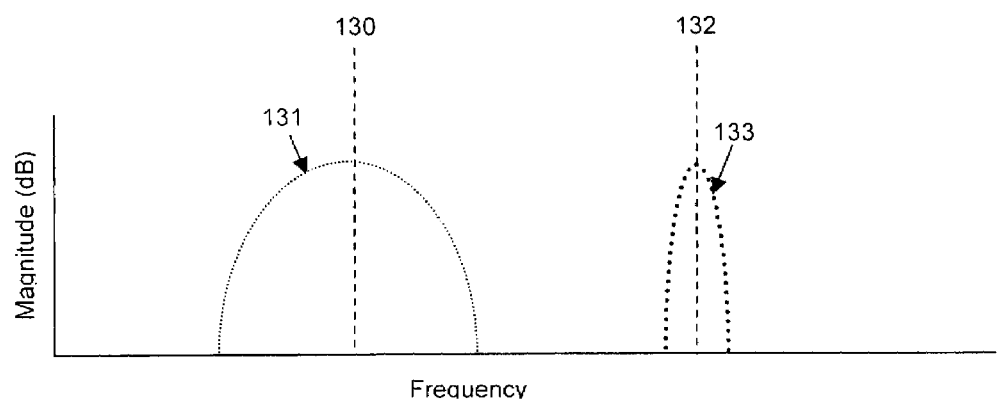
FIGS. 15(a)–(b) illustrate the transfer function of the present invention's fully programmable SAW filter with differing IDT synchronous frequencies.
Figure 15:
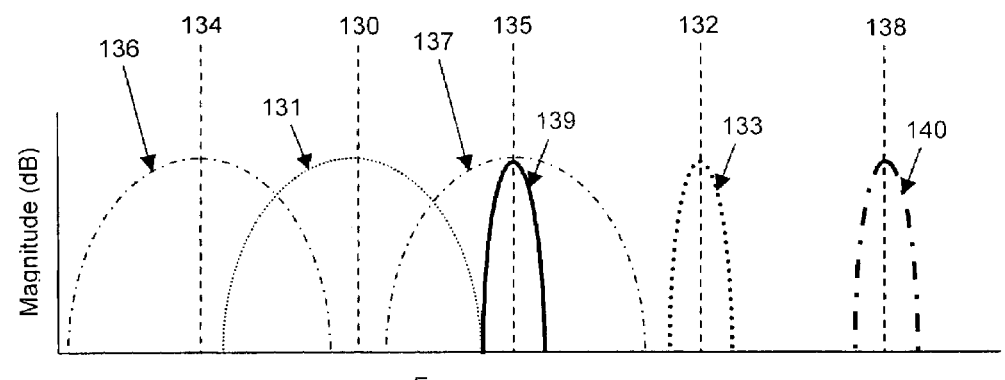

Referring now to FIG. 15, FIG. 15(a) depicts the untuned frequency response 133 of the tunable IDT input means occurring at a synchronous frequency 132 different from the synchronous frequency 130 of the frequency response 131 of the tunable IDT output means. The separation in the synchronous frequencies 130 and 132 is chosen large enough such that the IDT frequency responses 131 and 133 do not overlap. Since the IDT frequency responses 131 and 133 do not overlap, the net transfer function of the untuned filter is zero. FIG. 15(b) depicts the frequency response 139 obtained by properly tuning both the input IDT means and output IDT means. The input IDT means is tuned using real tap weights such that aliased input IDT passbands 139 and 140 occur at tuned frequencies 135 and 138 symmetrically disposed about the untuned input IDT synchronous frequency 132. Similarly, the output IDT means is tuned using real tap weights such that aliased output IDT passbands 136 and 137 occur at tuned frequencies 134 and 135 symmetrically disposed about the untuned output IDT synchronous frequency 130. The key point is that the tuned frequency for the upper passband of one IDT is made to coincide with the tuned frequency for the lower passband of the other IDT. In this configuration, the overlapping passbands 137 and 139 yield a net tuned response 139 as desired, while attenuating the aliased passbands 136 and 140. As may be appreciated from FIG. 15, broadband center frequency tuning is obtained since the center frequency is no longer limited to the range defined by the coupling bandwidth of a fixed input IDT. Further, this improvement is obtained while using a single channel device structure and real tap weights.

Figure 16:
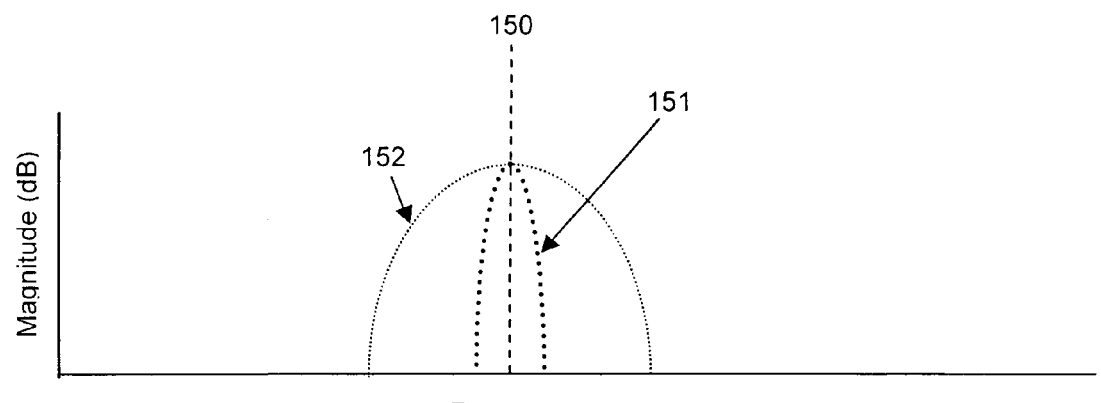
FIGS. 16(a)–(b) are diagrams of transfer function of the present invention illustrating the mechanisms of selectable bandwidth.
Figure 16:
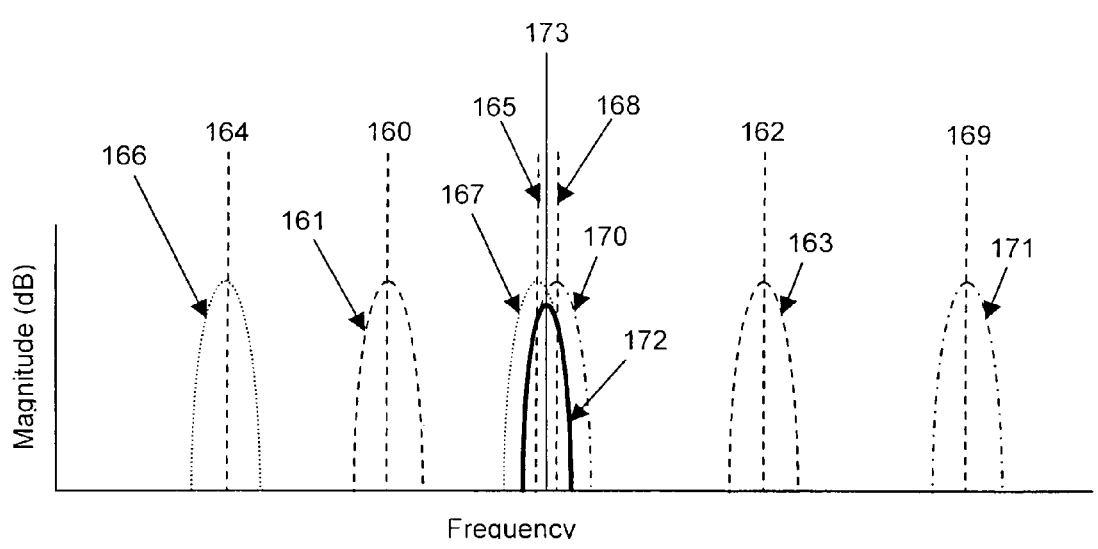

The maximum possible filter bandwidth for a given insertion loss is determined by the piezoelectric coupling of the SAW substrate. However, this invention does yield additional flexibility with regard to the minimum possible filter bandwidth. The minimum bandwidth in a SAW transversal filter generally is considered to be the transition bandwidth, which is inversely proportional to the time delay through the SAW device. Thus, the physical length of the device fixes the minimum possible bandwidth in a conventional SAW filter. In a partially programmable SAW filter, the bandwidth can be varied either by varying the active device length by turning taps on or off, or through control of the weighting function. This is illustrated in FIG. 16(a) for an IDT with synchronous frequency 150, where the frequency response 151 is shown under the conditions that all taps are active and the frequency response 152 is shown under the conditions that only a few taps are active.

In accordance with the present invention, somewhat narrower bandwidths are achievable through selective overlap of the input and output IDT transfer functions. This is illustrated in FIG. 16(b). The input IDT has synchronous frequency 162 and untuned transfer function 163, while the output IDT has synchronous frequency 160 and untuned transfer function 161. The input IDT is tuned using real tap weights to obtain aliased transfer functions 170 and 171 centered at tuned frequencies 168 and 169 symmetrically displaced about the untuned input IDT synchronous frequency 162. The output IDT is tuned using real tap weights to obtain aliased transfer functions 166 and 167 centered at tuned frequencies 164 and 165 symmetrically displaced about the untuned output IDT synchronous frequency 160. The lower passband center frequency 168 of the input IDT differs from the upper passband center frequency 165 of the output IDT, resulting in a net filter passband 172 whose shape and center frequency 173 depend in detail upon the component input and output transfer functions 170 and 167 respectively. There are two important points to note regarding this option. First, this option requires nonuniform rolloff in the transition band; i.e. the transition band is composed of a shoulder followed by skirts that are somewhat narrower than the total transition bandwidth. This can be achieved through selection of an appropriate weighting function to shape the passband. The narrowest possible bandwidth is then limited by the steepness of the skirts. The second point is that narrowing the bandwidth incurs a penalty in increased insertion loss. At first glance, this may appear to be a significant drawback, and clearly this is undesirable in applications where the available gain is limited. However, narrowing the bandwidth also reduces the system noise floor at nearly the same rate as the insertion loss is increased, leading to an essentially unchanged signal-to-noise ratio as the bandwidth is narrowed. Hence, where gain is not limited, the selective overlap option provides a viable approach to achieving narrower filter bandwidths than those imposed by the transition bandwidth. By way of illustration, selective overlap using max-rolloff weighting allows a minimum filter bandwidth ten times narrower than the transition band, with 10 dB of additional insertion loss but unchanged signal-to-noise ratio.

The present invention also addresses minimizing triple-transit-echo (TTE). TTE arises from two effects, namely mechanical reflections from the periodic array of electrode fingers and electrical regeneration. The use of substantially differing synchronous frequencies for the input and output IDTs eliminates the component of TTE arising from mechanical reflections. Multiple variations of the invention are possible with respect to electrical regeneration effects. In one variation suitable for a pulse detection trigger circuit, minimum insertion loss with maximum TTE would be achieved by matching the output impedance of the individual output IDT fingers to the input impedance of the tap weight circuitry. Another variation suitable for IF filtering in a communications receiver would feature increased insertion loss with reduced TTE by implementing a substantially lower input impedance for the tap weight circuitry as compared to the output impedance of the output IDT fingers.

The present invention centers upon the combination of tunable IDT transfer functions with differing synchronous frequencies to obtain selectable center frequency, passband bandwidth, passband shape and so on but also encompasses a number of variations and extended applications. The considered SAW IDT structures are bi-directional, hence obvious variations include three transducer structures designed to recover a portion of the bi-directional transducer loss and other multi-transducer structures implementing cascaded transfer functions. Further, the present invention has application to prior art fixed and partially programmable filter structures wherein the IDTs feature differing synchronous frequencies for the reduction of mechanical TTE, elimination of passband aliasing, etc. as may be desired.

The preferred embodiment of the present invention is intended to be illustrative and not limiting with respect to the variety of possible embodiments. The present invention may be also implemented using any of the well known surface acoustic wave types including but not limited to Rayleigh waves, leaky SAW, surface transverse waves, high-velocity pseudo-SAW, and so on. The present invention may be implemented using IDTs formed directly on the surface of a piezoelectric substrate, on the surface of a non-piezoelectric substrate with piezoelectric thin films underlying the IDT regions, using a piezoelectric semiconductor, or any other such material system for transducing and propagating surface acoustic waves as is well known in the art. The present invention may be implemented using discrete components, hybrid circuits, or in a fully integrated circuit. The tap weight circuitry may be implemented using separate variable gain amplifiers for each signal path or using the fixed gain amplifier and switch array embodiment as disclosed in U.S. Pat. No. 6,459,345 entitled "Programmable Transversal Filter Including Unidirectional Transducers," issued on Oct. 1, 2002 to co-inventors herein John A. Kosinski and Robert A. Pastore, Jr., which is hereby incorporated by reference. It is noted that the present invention is significantly different from the programmable transversal filters disclosed in that patent because of the use of differing synchronous frequencies for the input and output IDT means in the present invention. While U.S. Pat. No. 6,459,345 addresses issues of minimum insertion loss by the use of multi-phase interdigital transducers, it does not in any way address the issues of limited tuning range and passband aliasing incumbent in the use of a common synchronous frequency for the input and output IDT means. Further, while U.S. Pat. No. 6,459,345 minimizes the electrical component of triple transit echo, it does not in any way address the mechanical component of triple transit echo incumbent in the use of a common synchronous frequency for the input and output IDT means.

The present invention also encompasses a method for making a programmable RF SAW filter comprising the steps of forming a means for IDT input from a group of IDT input electrode fingers with the IDT input means having an input synchronous frequency, $F_{in}$, and forming a means for IDT output from a plurality of IDT output electrode fingers, with the IDT output means having an output synchronous frequency, $F_{out}$, differing from said input synchronous frequency, $F_{in}$, positioning the IDT input means and the IDT output means on a substrate, dividing an input signal into a multitude of signal paths applied to an input tap weight network that generates an individually weighted signal path applied to each of the IDT input electrode fingers. In a generating step, a surface acoustic wave is generated by the IDT input means that propagates to the IDT output means and aliased input IDT passbands about an untuned input IDT synchronous frequency, in a sending step, a plurality of electrical signals are sent from the IDT output means to an output tap weight network, with the IDT output means providing a zero net transfer function and a plurality of aliased IDT output passbands are generated at a plurality of tuned output frequencies symmetrically disposed about an untuned IDT output synchronous frequency and an output signal, which causes a passband overlap when an upper tuned frequency of the aliased IDT output passbands coincides with a lower frequency of the aliased IDT input passbands, permitting a net tuned response with a broadband selectable center frequency and a narrower selectable bandwidth, and the IDT output means provides the output signal as a weighted sum by a summation circuit. Many of the variations that apply to the RF programmable SAW filters of the present invention also apply to this invention's method.

It is to be further understood that other features and modifications to the foregoing detailed description of the selectable performance filter are within the contemplation of the present invention, which is not limited by this detailed description. Those skilled in the art will readily appreciate that any number of configurations of the present invention and numerous modifications and combinations of materials, components, geometrical arrangements and dimensions can achieve the results described herein, without departing from the spirit and scope of this invention. Accordingly, the present invention should not be limited by the foregoing description, but only by the appended claims.

We claim:

1. A method for making a programmable RF SAW filter, comprising the steps of;

forming a means for interdigital (IDT) input from a plurality of IDT input electrode fingers, said IDT input means having an input synchronous frequency, $F_{in}$;

forming a means for IDT output from a plurality of IDT output electrode fingers, said IDT output means having an output synchronous frequency, $F_{out}$, differing from said input synchronous frequency, $F_{in}$;

positioning said IDT input means and said IDT output means on a substrate, dividing an input signal into a multitude of signal paths applied to an input tap weight network generating an individually weighted signal path applied to each of said plurality of IDT input electrode fingers;

generating a surface acoustic wave from said IDT input means propagating to said IDT output means and a plurality of aliased input IDT passbands about an untuned input IDT synchronous frequency;

sending a plurality of electrical signals from said IDT output means to an output tap weight network, said IDT output means providing a zero net transfer function;

generating a plurality of aliased IDT output passbands at a plurality of tuned output frequencies symmetrically disposed about an untuned IDT output synchronous frequency and an output signal, causing a passband overlap when an upper tuned frequency of said plurality of aliased IDT output passbands coincides with a lower frequency of said plurality of aliased IDT input passbands, permitting a net tuned response with a broadband selectable center frequency, a narrower selectable bandwidth and a reduced electromagnetic interference from a plurality of unwanted RF signals, said IDT output means providing said output signal as a weighted sum by a summation circuit;

determining a maximum possible filter bandwidth for a given insertion loss by a piezoelectric coupling in said substrate;

determining an overall transfer function as a cascade of an IDT input transfer function and as a cascade of an IDT output transfer function;

incorporating a frequency translation of the IDT input means into said input tap weight network;

incorporating a frequency translation of the IDT output means into said output tap weight network;

forming a plurality of overlapping IDT transfer functions;

forming said plurality of IDT input electrode fingers with a plurality of IDT input gratings and a plurality of non-overlapping input mechanical reflection bands;

selecting an SAW transversal filter as said SAW filter;

allowing said narrower selectable bandwidth because said passband overlap is tunable;

forming each of said plurality of IDT input electrode fingers with a discrete input finger location, $x_n$;

tuning said IDT output means with a plurality of real output tap weights from said output tap weight network;

forming each of said plurality of IDT output electrode fingers with a discrete output finger location, $y_m$; and providing a plurality of non-overlapping output mechanical reflection bands from a plurality of IDT output gratings of said plurality of tunable IDT output electrode fingers to prevent an output mechanical triple-transit-echo.

2. The method for making the programmable RF SAW filter, as recited in claim 1, further comprising the step of arranging said plurality of IDT input electrode fingers in an IDT input array.

3. The method for making the programmable RF SAW filter, as recited in claim 2, further comprising the step of arranging said plurality of IDT output electrode fingers in an IDT output array.

4. The method for making the programmable RF SAW filter, as recited in claim 3, further comprising the step of forming said SAW transversal filter with a minimum insertion loss.

5. The method for making the programmable RF SAW filter, as recited in claim 4, further comprising the step of forming said SAW transversal filter with a maximum sidelobe rejection level.

6. The method for making the programmable RF SAW filter, as recited in claim 5, further comprising the step of forming said SAW transversal filter with a selectable filter transfer function.

7. The method for making the programmable RF SAW filter, as recited in claim 6, further comprising the step of tuning said IDT input array.

8. The method for making the programmable RF SAW filter, as recited in claim 7, further comprising the step of tuning said IDT output array.

9. The method for making the programmable RF SAW filter, as recited in claim 8, wherein said output synchronous frequency, $F_{out}$, being different from said input synchronous frequency, $F_{in}$, permits only a one of the plurality of aliased IDT output passbands to overlap only a one of the plurality of aliased input IDT passbands.

10. The method for making the programmable RF SAW filter, as recited in claim 9, further comprising the step of forming said SAW filter to be partially programmable.

11. The method for making the programmable RF SAW filter, as recited in claim 9, further comprising the step of forming said SAW filter to be a fully programmable SAW transversal filter.

12. The method for making the programmable RF SAW filter, as recited in claim 11, further comprising the step of installing said SAW filter into a single channel device.

13. An RF programmable SAW filter comprising:

a means for interdigital (IDT) input and a means for IDT output are positioned on a substrate;

said IDT input means being composed of a plurality of IDT input electrode fingers and having an input synchronous frequency, $F_{in}$;

each of said plurality of IDT input electrode fingers having a discrete input finger location, $x_n$, and a plurality of IDT input gratings with a plurality of non-overlapping input mechanical reflection bands;

a signal splitter divides an input signal into a multitude of signal paths applied to an input tap weight network generating an individually weighted signal path applied to each of said plurality of IDT input electrode fingers, said input tap weight network having a frequency translation of said IDT input means;

said IDT input means generates a surface acoustic wave propagating to said IDT output means and a plurality of aliased input IDT passbands about an untuned input IDT synchronous frequency;

said IDT output means, being composed of a plurality of IDT output electrode fingers and having an output synchronous frequency, $F_{out}$, that differs from said input synchronous frequency, $F_{in}$, sends a plurality of electrical signals to an output tap weight network and provides a zero net transfer function, said output tap weight network having a frequency translation of the IDT output means to achieve a plurality of overlapping IDT transfer functions, each of said plurality of IDT output electrode fingers having a discrete output finger location, $y_m$;

said IDT output means being tuned by a plurality of real output tap weights from said output tap weight network;

said IDT output means generates a plurality of aliased IDT output passbands at a group of tuned output frequencies symmetrically disposed about an untuned IDT output synchronous frequency and an output signal;

an upper tuned frequency of said plurality of aliased IDT output passbands that coincides with a lower frequency of said plurality of aliased IDT input passbands causes a tunable passband overlap that permits a net tuned response with a broadband selectable center frequency, a narrower selectable bandwidth and a reduced electromagnetic interference from a plurality of unwanted RF signals, said IDT output means providing said output signal as a weighted sum by a summation circuit;

said tunable passband overlap allows said narrower selectable bandwidth;

a maximum possible filter bandwidth for a given insertion loss is determined by a piezoelectric coupling in said substrate;

an overall transfer function being determined as a cascade of an IDT input transfer function and as a cascade of an IDT output transfer function;

said SAW filter being an SAW transversal filter;

said plurality of non-overlapping input mechanical reflection bands from said plurality of IDT input gratings of said plurality of IDT input electrode fingers prevents an input mechanical triple-transit-echo; and a plurality of non-overlapping output mechanical reflection bands from a plurality of IDT output gratings of said plurality of IDT output electrode fingers prevents an output mechanical triple-transit-echo.

14. The RF programmable SAW filter, as recited in claim 13, further comprising said plurality of IDT input electrode fingers being arranged in an IDT input array.

15. The RF programmable SAW filter, as recited in claim 14, further comprising said plurality of IDT output electrode fingers being arranged in an IDT output array.

16. The RF programmable SAW filter, as recited in claim 15, further comprising a minimum insertion loss.

17. The RF programmable SAW filter, as recited in claim 16, further comprising a maximum sidelobe rejection level.

18. The RF programmable SAW filter, as recited in claim 17, further comprising a selectable filter transfer function.

19. The RF programmable SAW filter, as recited in claim 18, further comprising said IDT input array being tunable.

20. The RF programmable SAW filter, as recited in claim 19, further comprising said IDT output array being tunable.

21. The RF programmable SAW filter, as recited in claim 20, further comprising said output synchronous frequency, $F_{out}$, being different from said input synchronous frequency, $F_{in}$, permits only a one of the plurality of aliased IDT output passbands to overlap only a one of the plurality of aliased input IDT passbands.

22. The RF programmable SAW filter, as recited in claim 21, further comprising said SAW transversal filter being partially programmable.

23. The RF programmable SAW filter, as recited in claim 21, further comprising said SAW transversal filter being a fully programmable SAW transversal filter.

24. The RF programmable SAW filter, as recited in claim 23, further comprising said SAW transversal filter being installed in a single channel device.

25. An RF partially programmable SAW filter comprising:

a means for fixed interdigital (IDT) input and a means for IDT output are positioned on a substrate;

said fixed IDT input means being composed of a plurality of IDT input electrode fingers and having an input synchronous frequency, $F_{in}$;

each of said plurality of IDT input electrode fingers having a discrete input finger location, $x_n$, and a plurality of IDT input gratings with a plurality of non-overlapping input mechanical reflection bands;

a signal splitter divides an input signal into a multitude of signal paths applied to an input tap weight network generating an individually weighted signal path applied to each of said plurality of IDT input electrode fingers, said input tap weight network having a frequency translation of said fixed IDT input means;

said fixed IDT input means generates a surface acoustic wave propagating to said IDT output means and a plurality of aliased input IDT passbands about an untuned input IDT synchronous frequency;

said IDT output means, being composed of a plurality of IDT output electrode fingers and having an output synchronous frequency, $F_{out}$, that differs from said input synchronous frequency, $F_{in}$, sends a plurality of electrical signals to an output tap weight network and provides a zero net transfer function, said output tap weight network having a frequency translation of the IDT output means to achieve a plurality of overlapping IDT transfer functions, each of said plurality of IDT output electrode fingers having a discrete output finger location, $y_m$;

said IDT output means being tuned by a plurality of real output tap weights from said output tap weight network, said IDT output means generates a plurality of aliased IDT output passbands at a group of tuned output frequencies symmetrically disposed about an untuned IDT output synchronous frequency and an output signal;

an upper tuned frequency of said plurality of aliased IDT output passbands that coincides with a lower frequency of said plurality of aliased IDT input passbands causes a tunable passband overlap that permits a net tuned response with a broadband selectable center frequency, a narrower selectable bandwidth and a reduced electromagnetic interference from a plurality of unwanted RF signals, said IDT output means providing said output signal as a weighted sum by a summation circuit;

said tunable passband overlap allows said narrower selectable bandwidth;

a maximum possible filter bandwidth for a given insertion loss is determined by a piezoelectric coupling in said substrate;

an overall transfer function being determined as a cascade of an IDT input transfer function and as a cascade of an IDT output transfer function;

said SAW filter being an SAW transversal filter;

said plurality of non-overlapping input mechanical reflection bands from said plurality of IDT input gratings of said plurality of IDT input electrode fingers prevents an input mechanical triple-transit-echo; and a plurality of non-overlapping output mechanical reflection bands from a plurality of IDT output gratings of said plurality of IDT output electrode fingers prevents an output mechanical triple-transit-echo.

26. The RF partially programmable SAW filter, as recited in claim 25, further comprising said plurality of fixed IDT input electrode fingers being arranged in an IDT input array.

27. The RF partially programmable SAW filter, as recited in claim 26, further comprising said plurality of IDT output electrode fingers being arranged in an IDT output array.

28. The RF partially programmable SAW filter, as recited in claim 27, further comprising a minimum insertion loss.

29. The RF partially programmable SAW filter, as recited in claim 28 further comprising, a maximum sidelobe rejection level.

30. The RF partially programmable SAW filter, as recited in claim 29, further comprising a selectable filter transfer function.

31. The RF partially programmable SAW filter, as recited in claim 30, further said IDT output array being tunable.

32. The RF partially programmable SAW filter, as recited in claim 31, further comprising said output synchronous frequency, $F_{out}$, being different from said input synchronous frequency, $F_{in}$, permits only a one of the plurality of aliased IDT output passbands to overlap only a one of the plurality of aliased input IDT passbands.

33. An RF fully programmable SAW filter comprising:
a means for tunable interdigital (IDT) input and a means for tunable IDT output are positioned on a substrate;
said tunable IDT input means being composed of a plurality of tunable IDT input electrode fingers and having an input synchronous frequency $F_{in}$;
each of said plurality of tunable IDT input electrode fingers having a discrete input finger location, $x_n$, and a plurality of IDT input gratings with a plurality of non-overlapping input mechanical reflection bands;
each of said plurality of IDT input electrode fingers being connected to a separate input bonding pad coupled to an external input tap weight circuit;
a signal splitter divides an input signal into a multitude of signal paths applied to an input tap weight network generating an individually weighted signal path applied to each of said plurality of tunable IDT input electrode fingers, said input tap weight network having a frequency translation of said tunable IDT input means;
said frequency translation of the tunable IDT input means being incorporated into said input tap weight network and said frequency translation of the tunable IDT output means being incorporated into said output tap weight network achieves a plurality of overlapping IDT transfer functions;
said tunable IDT input means generates a surface acoustic wave propagating to said IDT output means and a plurality of aliased input IDT passbands about an untuned input IDT synchronous frequency;
said tunable IDT output means, being composed of a plurality of tunable IDT output electrode fingers and having an output synchronous frequency, $F_{out}$, that differs from said input synchronous frequency, $F_{in}$, sends a plurality of electrical signals to an output tap weight network and provides a zero net transfer function, said output tap weight network having a frequency translation of the tunable IDT output means to achieve a plurality of overlapping IDT transfer functions, each of said plurality of tunable IDT output electrode fingers having a discrete output finger location, $y_m$;
said tunable IDT output means being tuned by a plurality of real output tap weights from said output tap weight network;
said tunable IDT output means generates a plurality of aliased IDT output passbands at a group of tuned output frequencies symmetrically disposed about an untuned IDT output synchronous frequency and an output signal;
an upper tuned frequency of said plurality of aliased IDT output passbands that coincides with a lower frequency of said plurality of aliased IDT input passbands causes a tunable passband overlap that permits a net tuned response with a broadband selectable center frequency, a narrower selectable bandwidth and a reduced electromagnetic interference from a plurality of unwanted RF signals, said IDT output means providing said output signal as a weighted sum by a summation circuit;
said tunable passband overlap allows said narrower selectable bandwidth,
a maximum possible filter bandwidth for a given insertion loss is determined by a piezoelectric coupling in said substrate;
an overall transfer function being determined as a cascade of an IDT input transfer function and as a cascade of an IDT output transfer function;
said SAW filter being a fully programmable SAW transversal filter;
said plurality of non-overlapping input mechanical reflection bands from said plurality of IDT input gratings of said plurality of IDT input electrode fingers prevents an input mechanical triple-transit-echo; and
a plurality of non-overlapping output mechanical reflection bands from a plurality of IDT output gratings of said plurality of tunable IDT output electrode fingers prevents an output mechanical triple-transit-echo.

34. The RF fully programmable SAW filter, as recited in claim 33, further comprising said plurality of tunable IDT input electrode fingers being arranged in an IDT input array.

35. The RF fully programmable SAW filter, as recited in claim 34, further comprising said plurality of tunable IDT output electrode fingers being arranged in an IDT output array.

36. The RF fully programmable SAW filter, as recited in claim 35, further comprising a minimum insertion loss.

37. The RF fully programmable SAW filter, as recited in claim 36, further comprising, a maximum sidelobe rejection level.

38. The RF fully programmable SAW filter, as recited in claim 37, further comprising a selectable filter transfer function.

39. The RF fully programmable SAW filter, as recited in claim 38, further comprising said output synchronous frequency, $F_{out}$, being different from said input synchronous frequency, $F_{in}$, permits only a one of the plurality of aliased IDT output passbands to overlap only a one of the plurality of aliased input IDT passbands.

40. The RF fully programmable SAW filter, as recited in claim 39, further comprising said SAW filter being installed in a single channel device.

* * * * *